United States Patent
Lee

(10) Patent No.: US 6,405,342 B1
(45) Date of Patent: Jun. 11, 2002

(54) DISK DRIVE EMPLOYING A MULTIPLE-INPUT SEQUENCE DETECTOR RESPONSIVE TO RELIABILITY METRICS TO IMPROVE A RETRY OPERATION

(75) Inventor: Patrick J. Lee, San Jose, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 0 days.

(21) Appl. No.: 09/393,511

(22) Filed: Sep. 10, 1999

(51) Int. Cl.$^7$ ................................................ G06F 11/10
(52) U.S. Cl. ...................................... 714/792; 714/795
(58) Field of Search ............................... 714/795, 792, 714/756, 755

(56) References Cited

U.S. PATENT DOCUMENTS

| | | | |
|---|---|---|---|
| 5,537,444 A | | 7/1996 | Nill et al. |
| 5,689,532 A | | 11/1997 | Fitzpatrick |
| 5,844,947 A | | 12/1998 | Cesari |
| 5,917,859 A | | 6/1999 | Yamasaki et al. |
| 5,938,790 A | | 8/1999 | Marrow |
| 5,940,416 A | | 8/1999 | Nishiya et al. |
| 5,949,831 A | | 9/1999 | Coker et al. |
| 6,009,549 A | * | 12/1999 | Bliss et al. .................. 714/769 |
| 6,345,074 B1 | * | 2/2002 | Turk et al. ................... 375/341 |

OTHER PUBLICATIONS

Joachim Hagenauer, Elke Offer and Lutz Papke; "Iterative Decoding of Binary Block and Convolutional Codes"; IEEE Transactions on Information Theory, vol. 42, No. 2, Mar. 1996.

Claude Berrou, Alain Glavieux and Punya Thitimajshima; "Near Shannon Limit Error—Correcting Coding and Decoding: Turbo–Codes (1)"; Proc., IEEE Int. Conf. on Comm.; Geneva, Switzerland; pp. 1064–1070, May 1993.

Wicker, Stephen B. and Bhargava, Vijay K., " Reed Solomon Codes and Their Applications", 1994, pp. 242–271, Chapter 11, Institute of Electrical Engineers, Inc., New York, NY.

Ryan, William E. and McPheters, Laura L. and McLaughlin, Steven W., "Combined Turbo Coding and Turbo Equalization for PR4–Equalized Lorentzian Channels", Jun. 1998, IEEE ICC'98.

Hagenauer, Joachim and Hoeher, Peter, "A Viterbi Algorithm with Soft–Decision Outputs and its Applications", Nov. 1989, pp. 1680–1686, IEEE Globecom Conference, Dallas, TX.

Beuurou, Claude and Glavieux, Alain and Thitimajshima, Punya, "Near Shannon Limit Error—Correcting Coding and Decoding: Turbo–Codes (1)", 1993, pp. 1064–1070, IEEE ICC'93.

(List continued on next page.)

Primary Examiner—Phung M. Chung
(74) Attorney, Agent, or Firm—Milad G. Shara, Esq.

(57) ABSTRACT

A disk storage system is disclosed employing an improved retry operation. The disk drive comprises a disk for storing a data block, and a head for reading the data block to generate an analog read signal during an initial read operation. A sampler samples the analog read signal to generate a sequence of read signal sample values, and a multiple-input sequence detector detects an initial estimated data sequence from the read signal sample values during the initial read operation. A reliability metrics generator generates reliability metrics representing an estimated reliability for data in the initial estimated data sequence, and the reliability metrics are stored in a local memory. During a retry operation, a memory controller transfers the reliability metrics generated during the initial read operation to the multiple-input sequence detector which generates a retry estimated data sequence using the reliability metrics, whereby the reliability metrics improves the probability of accurately detecting the retry estimated data sequence.

18 Claims, 11 Drawing Sheets

OTHER PUBLICATIONS

Ryan, William E., "A Turbo Code Tutorial", New Mexico State University.

Raphaeli, Dan and Zarai, Yoram, "Combined Turbo Equalization And Turbo Decoding", Sep. 1997, pp. 639–643, IEEE Int. Smp. On Turbo Codes.

Aitsab, Omar and Pyndiah, Ramesh, Performance of Reed–Solomon Block Turbo Code, 1996, pp. 121–124, IEEE Globecom'96.

Chase, David, "A Class of Algorithms for Decoding Block Codes With Channel Measurement Information", Jan. 1972, pp. 170–182, IEEE Transactions of Information Theory, vol. IT–18, No. 1.

Veterbi, Andrew J., "An Intuitive Justification and a Simplified Implementation of the MAP Decoder for Convolutional Codes", Feb. 1998, pp. 260–264, IEEE JSAC.

Narayanan, Krishna R. and Stuber, Gordon L., "List Decoding of Turbo Codes", Jun. 1998, pp. 754–762, IEEE Trans Comm.

Bahl, L.R. and Cooke, J. and Jelinek, F. and Raviv, J., Optimal Decoding of Linear Codes for Minimizing Symbol Error Rate, Mar. 1974, pp. 284–287, IEEE Trans. Info. Theory.

McLaughlin, Steven W. and McPheters, Laura L., "Turbo Codes and Turbo Equalization for PR4 Magnetic Recording", pp. 1–23, School of Electrical and Computer Engineering, Georgia Institute of Technology.

Bennedetto, S. and Divsalar, D. and Montorsi, G. and Pollara, F., "Serial Concatenation of Interleaved Codes: Performance Analysis, Design, and Iterative Decoding", Aug. 15, 1996, pp. 1–26, JPL Progress Rep. 42–126.

Hagenauer, Joachim and Offer, Elke and Papke, Lutz, "Iterative Decoding of Binary Block and Convolutional Codes", Mar. 1996, pp. 429–445, IEEE Transactions on Information Theory, vol. 42, No. 2.

Forney, G. David, Jr. "Generalized Minimum Distance Decoding", Apr. 1996, pp. 125–131, IEEE Trans. Info. Theory.

* cited by examiner

DISK DRIVE EMPLOYING A MULTIPLE-INPUT SEQUENCE DETECTOR RESPONSIVE TO RELIABILITY METRICS TO IMPROVE A RETRY OPERATION

BACKGROUND OF THE INVENTION

1. Field of the Invention

The present invention relates to disk drives. More particularly, the present invention relates to a disk drive employing a multiple-input sequence detector responsive to reliability metrics for improving a retry operation.

2. Description of the Prior Art

Disk drives for computer systems typically execute retry operations when a data block recorded on a disk is unrecoverable during an initial read operation due to a low signal-to-noise ratio (SNR) in the read signal which prevents accurate detection of the data. Because the magnitude and character of the noise during any given read operation can vary, rereading the data block during retry operations may result in at least one read operation where the SNR is high enough to accurately recover the data block. However, it may require numerous retry operations to successfully recover the data block which can increase the latency of the disk drive as it must wait for the disk to complete a revolution with each retry. Furthermore, the SNR may never be high enough to enable recovery of the data block regardless as to the number of retries, which means the data block is permanently lost. Losing data blocks becomes more problematic as the SNR decreases due to the increasing demand for disk drives with higher areal storage density.

Modulation and error correction codes (ECC) are typically employed in disk drives in order to increase the effective SNR and thereby improve the reliability and decrease the latency involved with retry operations. Examples of modulation codes include a run length limited (RLL) code which limits the spacing between adjacent surface alterations on the disk in order to limit intersymbol interference (ISI), a distortion in the read signal caused by closely spaced, overlapping pulses. For example, in a system where a binary "1" bit modulates a surface alteration and a "0" bit modulates no surface alteration (i.e., NRZI recording), an RLL (d,k) code constrains the recorded data sequence such that at least d "0" bits occur between consecutive "1" bits, thereby ensuring that consecutive surface alterations are spread apart to limit ISI. Other examples of modulation codes include trellis codes, matched spectral null codes, and other codes directed at increasing the effective SNR.

Modulation codes are typically augmented by ECC codes which further increase the effective SNR by encoding the user data into codewords that exhibit a minimum distance property measured relative to a Hamming distance. The Hamming distance defines the difference between valid codewords of the ECC code, and the minimum Hamming distance defines the correction power of the ECC code.

The extent that modulation and ECC codes increase the effective SNR is referred to as the "coding gain", which is normally measured as the SNR difference (in dB) between a system with coding and a system without coding that will achieve a specified bit error rate. There is a limit, however, to the amount of gain that modulation and ECC codes can provide in a storage system because of the additional redundancy required to implement the code which decreases the user data density. This ratio of user data bits to codeword bits is referred to as the code rate; as the code rate decreases, the channel density must increase in order to maintain a desired user data density. There is a true coding gain only if the code rate is large enough to allow an increase in the user data density as compared to an uncoded system. Thus, the extent that modulation and ECC codes increase the effective SNR and thereby improve the reliability and decrease the latency involved with retry operations is limited.

Other techniques have also been employed in disk drives in order to increase the effective SNR and thereby improve retry operations. As mentioned above, ISI typically causes the SNR in the read signal to decrease as the areal density increases. In addition to RLL codes, various filtering techniques have been employed in the prior art to slim the pulses in order to reduce the undesirable degradation caused by ISI, but filtering the read signal tends to boost the high frequency noise. More recent disk drives employ special signal processing techniques referred to as partial response (PR) equalization with maximum likelihood (ML) sequence detection or PRML sequence detection which allows for a controlled amount of ISI rather than attempting to eradicate it through filtering. Since the effect of the controlled ISI in PRML systems is known, it can be taken into account in the sequence detection algorithm when demodulating the read signal into an estimated data sequence. This increases the effective SNR and thereby improves the reliability and decreases the latency involved with retry operations; however, the extent that known PRML systems improve performance during retries is limited.

There is, therefore, a need for a disk drive with an enhanced capability of accurately decoding a data block deemed unrecoverable during an initial read operation by improving a retry operation. In particular, there is a need to reduce the number of retries and associated latency required to accurately recover a data block, as well as to improve retries in order to recover an otherwise unrecoverable data block.

SUMMARY OF THE INVENTION

The present invention may be regarded as a disk drive employing an improved retry operation. The disk drive comprises a disk for storing a data block, and a head for reading the data block to generate an analog read signal during an initial read operation. A sampler samples the analog read signal to generate a sequence of read signal sample values, and a multiple-input sequence detector detects an initial estimated data sequence from the read signal sample values during the initial read operation. A reliability metrics generator generates reliability metrics representing an estimated reliability for data in the initial estimated data sequence, wherein the reliability metrics are stored in a local memory. During a retry operation, a memory controller transfers the reliability metrics generated during the initial read operation to the multiple-input sequence detector which generates a retry estimated data sequence using the reliability metrics, whereby the reliability metrics improves the probability of accurately detecting the retry estimated data sequence.

The present invention may also be regarded as a method of improving a retry operation in a disk drive. A data block stored on a disk is read to generate an analog read signal. The analog read signal is sampled to generate a sequence of read signal sample values, and an estimated data sequence is detected from the read signal sample values. Reliability metrics are generated representing an estimated reliability for data in the estimated data sequence, wherein the reliability metrics are stored in a local memory. During a retry operation, the data block is reread and the step of detecting an estimated data sequence responds to the reliability metrics generated during a previous read operation which improves the probability of accurately detecting the estimated data sequence during the retry operation.

DESCRIPTION OF THE PREFERRED EMBODIMENTS

System Overview

Figure 1:
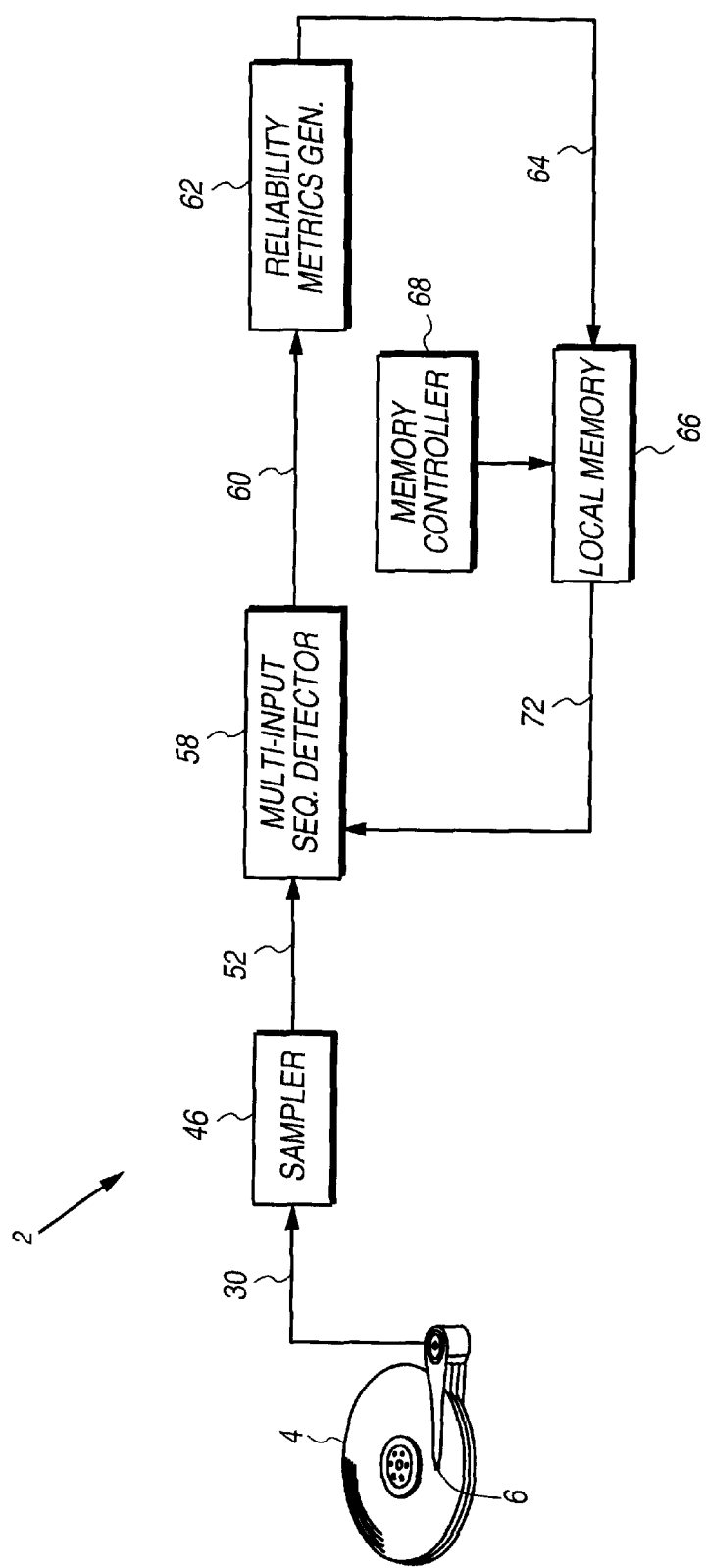
FIG. 1 is a block diagram overview of a suitable disk drive according to an embodiment of the invention comprising a multiple-input sequence detector for processing read signal samples to generate an initial estimated data sequence during an initial read operation and a local memory for storing reliability metrics generated in response to the initial estimated data sequence, wherein the multiple-input sequence detector generates a retry estimated data sequence using the reliability metrics during a retry operation.

Referring to FIG. 1, shown is a suitable disk drive 2 according to one embodiment of the present invention. The disk drive 2 comprises a disk 4, a head 6, a sampler 46, a multiple-input sequence detector 58, a reliability metrics generator 62, a local memory 66, and a memory controller 68. The head 6 reads a data block stored on the disk 4 to generate an analog read signal 30 during an initial read operation. The sampler 46 samples the analog read signal 30 to generate a sequence of read signal sample values 52. The multiple-input sequence detector 58 is responsive to the read signal sample values 52 for generating an initial estimated data sequence 60 during the initial read operation. The reliability metrics generator 62 generates reliability metrics 64 representing an estimated reliability for data in the initial estimated data sequence 60. The reliability metrics 64 are stored in the local memory 66 and the memory controller transfers the reliability metrics 64 stored in the local memory to the multiple-input sequence detector. During a retry operation, the data block is reread from the disk, the memory controller 68 transfers the reliability metrics 64 generated during the initial read operation to the multiple-input sequence detector 58, and the multiple-input sequence detector 58 generates a retry estimated data sequence using the reliability metrics 72, whereby the reliability metrics improves the probability of accurately detecting the retry estimated data sequence.

Preferably, the sampler 46 is an analog-to-digital converter (ADC) which converts the analog read signal 30 into digital sample values processed by the downstream circuitry implemented using well known digital techniques. Alternatively, the sampler 46 could be implemented as a sample-and-hold (S/H) circuit with the downstream circuitry implemented using well known discrete-time analog (DTA) techniques. In yet another alternative embodiment, a hybrid configuration could be employed: the sampler 46 could be implemented as a S/H circuit, a portion of the downstream circuitry implemented in DTA circuitry, the analog sample values then converted into digital sample values and the remaining downstream circuitry implemented in digital circuitry.

The read signal sample values 52 are processed by the multiple-input sequence detector 58 which evaluates the read signal sample values 52 in context to determine the most likely recorded sequence to have generated the read signal sample values 52. As will be explained in greater detail below, the multiple-input sequence detector 58 comprises a metrics calculator for computing the state metrics of a trellis matched to a PR target. Example embodiments for a suitable multiple-input sequence detector 58 include a Viterbi sequence detector, or an iterative detector such as a maximum a posteriori (MAP) detector commonly employed in Turbo coding.

If a data block cannot be successfully recovered during an initial read operation, then during a retry operation a retry procedure (such as FIGS. 9A–9B) is executed by a microprocessor, such as a microprocessor of a disk controller (not shown). During the retry operation, the memory controller 68 controls the transfer of the stored reliability metrics 72 to the multiple-input sequence detector 58. Note that the memory controller 68 could be implemented using the disk controller and therefore is not necessarily a separate component of the disk drive. The multiple-input sequence detector 58 responds to the stored reliability metrics 72 by biasing the computing of the state metrics. The estimated data sequence 60 output by the multiple-input sequence detector 58 during the retry operation is more accurate due to the influence of the stored reliability metrics 72. Consequently, the present invention reduces the number of retries necessary to recover a data block, and may enable the accurate recovery of an otherwise unrecoverable data block. Further, since the reliability metrics are generated during the initial read operation and stored in the local memory 66, there is no additional latency needed to generate the reliability metrics during the retry operation.

The elements shown in FIG. 1 could be implemented independently in separate integrated circuits, or they could be selectively combined into fewer integrated circuits, or even into one integrated circuit. Further, the preferred configuration may depend on the particular implementation for the reliability metrics generator 62. In one embodiment disclosed below, the reliability metrics 64 are the bits of a decoded codeword in an N-way interleaved ECC system and therefore the reliability metrics generator 62 is implemented as part of a suitable ECC controller which preferably resides in a disk controller (not shown). In an alternative embodiment disclosed below, the multiple-input sequence detector 58 comprises multiple iterative detectors wherein the reliability metrics 64 are generated by one of the iterative detectors. Thus, in this latter embodiment the reliability metrics generator 62 is implemented as part of a suitable read/write channel (not shown). The general operation of the multiple-input sequence detector 58 and the manner in which the reliability metrics modify the computing of the state metrics is described in the following section.

Multiple-Input Sequence Detector

Figure 2:
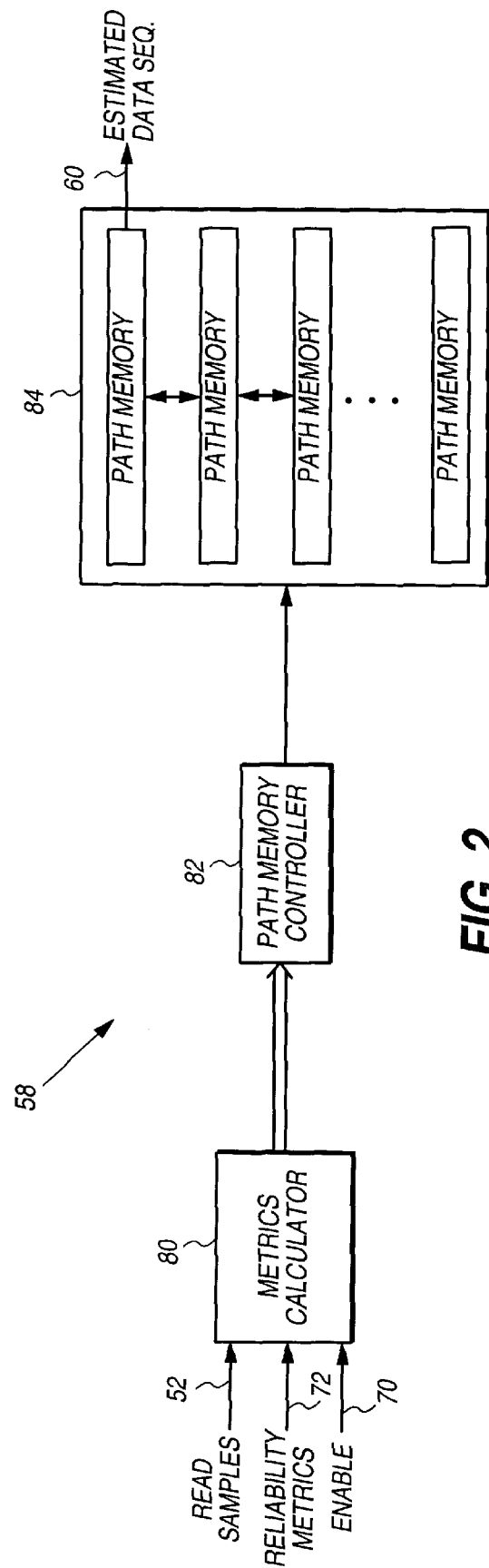
FIG. 2 is an overview of the multiple-input sequence detector of FIG. 1 comprising a metrics calculator for computing state metrics from the read signal samples during the initial read operation, and also from the reliability metrics during the retry operation.

Referring now to FIG. 2, shown is a suitable multiple-input sequence detector 58 comprising a metrics calculator 80, a path memory controller 82, and path memory 84. The metrics calculator 80 processes the read signal sample values 52 during an initial read operation to compute the state metrics associated with the trellis. The path memory controller 82 responds to the state metrics by updating the path memories 84 which store the estimated data sequences. In a Viterbi sequence detector, for example, the metrics calculator 80 computes Euclidean metrics, and the path memories 84 store estimated binary sequences which merge into a most likely estimated data sequence 60 after a certain number of read signal sample values 52 have been processed. The estimated data sequence 60 output by the multiple-input sequence detector 58 is processed by the reliability metrics generator 62 of FIG. 1 which generates reliability metrics 64 associated with the data in the estimated data sequence 60. During retry operations, the metrics calculator 80 of FIG. 2 is configured so that it responds to the reliability metrics 72 stored in the local memory 66. The stored reliability metrics 72 are used to bias the computing of the state metrics in order to improve the probability of accurately detecting the estimated data sequence 60 output by the sequence detector 58 during a retry operation. The reliability metrics 64 may be generated from various alternative sources, including for example, the bits of a decoded codeword in a N-way interleaved ECC system, or the reliability metrics generated by an iterative detector such as in a Turbo code decoder. Both of these embodiments are disclosed in the following sections.

N-Way Interleaved ECC Reliability Metrics

Referring to 3, shown is a suitable disk drive 10 according to one embodiment of the present invention wherein the reliability metrics 64 of FIG. 1 are generated as the bits of a decoded ECC codeword 64A. In addition to the elements shown in FIG. 1, the disk drive 10 of FIG. 3 includes an RLL encoder 116, an N-way ECC encoder 120, a precoder 124, and an RLL decoder 126. The disk storage system 10 also may comprise an optional samples buffer 107 for implementing an alternative embodiment described below. The reliability metrics generator 62 of FIG. 1 is implemented in FIG. 3 as an N-way ECC decoder 106 for generating reliability metrics as the bits of a decoded codeword 64A.

Figure 3:
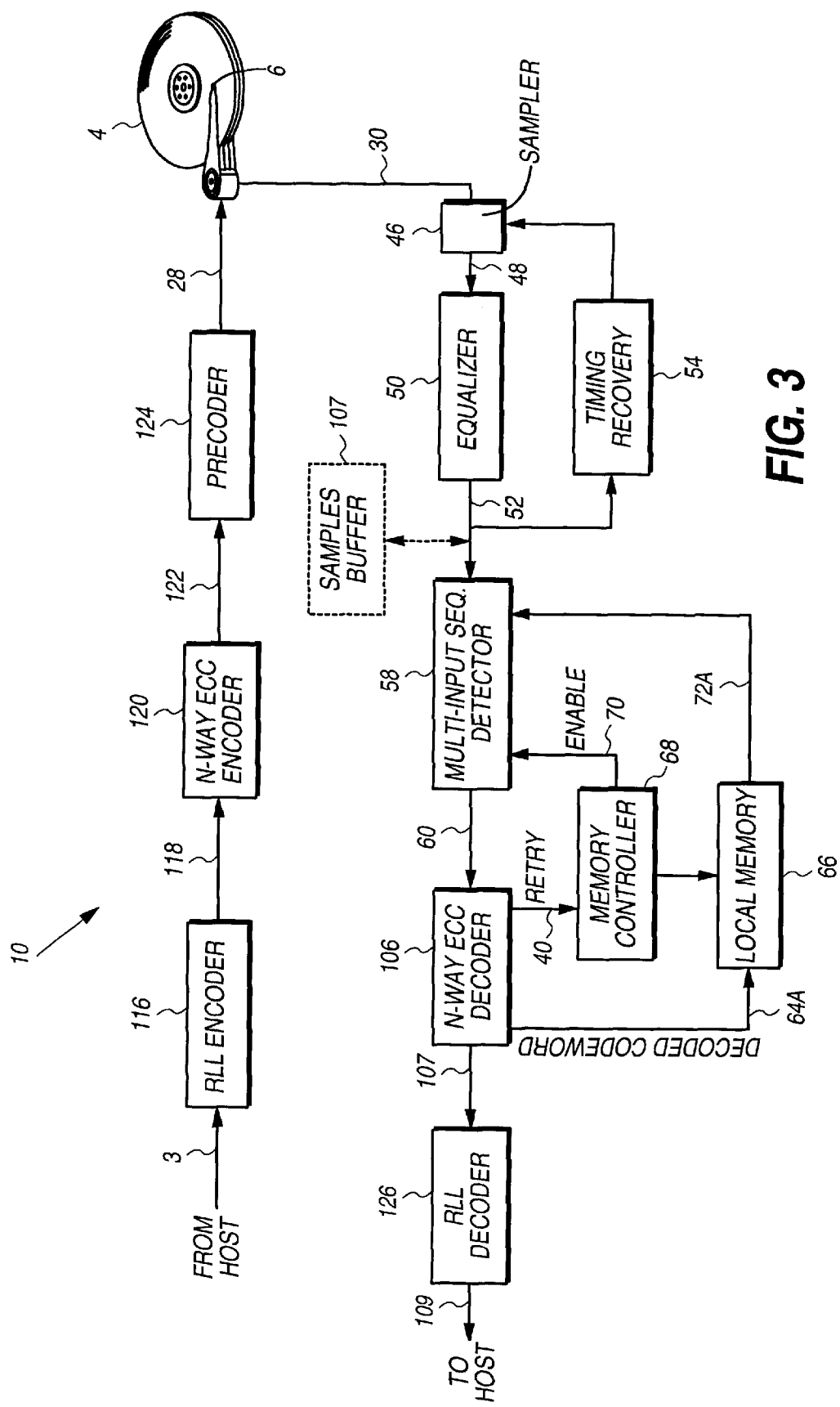
FIG. 3 is a block diagram showing an ECC embodiment for generating reliability metrics as the bits of a decoded codeword of a multiple interleaved ECC system illustrated in FIGS. 4A–4C.

The disk drive of FIG. 3 also comprises an equalizer 50 and a timing recovery circuit 54. The equalizer 50 is suitably implemented as a finite-impulse-response (FIR) filter comprising a sufficient number of coefficients to adequately shape the read signal sample values 48 toward a suitable PR target (e.g., PR4, EPR4 or EEPR4 target). The timing recovery circuit 54 processes the read signal sample values 52 output by the equalizer 50 to extract timing information from the read signal; the timing information is used to synchronize the sampler 46 so that it samples the analog read signal 30 synchronous to the baud rate. For example, the timing recovery circuit 54 may generate a phase error between the equalized read signal sample values 52 and expected sample values corresponding to the PR target. The sampler 46 suitably comprises a variable frequency oscillator (VFO) responsive to the phase error for generating a sampling clock 56 synchronized to the baud rate; the sampling clock 56 in turn controls the sampler 46 such that it samples the analog read signal 30 synchronous to the baud rate. An alternative embodiment for timing recovery is to sample the analog read signal 30 asynchronous to the baud rate and then interpolate the asynchronous sample values to generate read signal sample values synchronized to the baud rate. In this embodiment, the phase error is used to generate an interpolation interval between the read signal sample values and the expected sample values of the PR target. An interpolation filter interpolates the asynchronous samples in response to the interpolation interval to generate read signal sample values synchronized to the baud rate.

The user data 3 received from the host is preferably first encoded according to a modulation code, such as an RLL code, and then encoded according to an ECC code, such as the well known Reed-Solomon code. A reason the modulation code (RLL code) is preferably the outer code is to avoid the error propagation that would otherwise occur if the modulation code were the inner code. A suitable RLL encoder 116 encodes the user data 3 received from the host to generate channel data 118 which is then encoded according to the ECC code by a suitable N-way ECC encoder 120, such as a Reed-Solomon encoder, to generate interleaved ECC codewords. Because the ECC code is the inner code, the redundancy symbols generated in ECC encoding the channel data 118 should also be encoded according to the modulation code constraints. Thus, the N-way ECC encoder 120 of FIG. 3 comprises a suitable modulation code encoder (RLL encoder) for encoding the ECC redundancy symbols according to the modulation code constraint (RLL constraint). The ECC encoded data 122 is then precoded by a suitable precoder 124 which compensates for the transfer function of the PR read channel in order to facilitate encoding the modulation code constraints. A suitable precoder for a PR4 read channel, for example, is a $1/(1+D^2)$ filter where the "+" is an exclusive-or operator. The write data 28 output by the precoder 124 modulates the current in the write coil of the head 6 in order to record the write data 28 to the disk 4.

During an initial read operation when attempting to read a data block (data sector) from the disk 4, the read signal 30 emanating from the head 6 is sampled by sampler 46, the read signal samples 48 filtered by equalizer 50 according to the desired PR target, and the sampler 46 synchronized by the timing recovery circuit 54 as described above. The read signal samples 52 at the output of the equalizer 50 are processed by the multiple-input sequence detector 58 which detects the estimated data sequence 60 processed by the N-way ECC decoder 106. The N-way ECC decoder 106 comprises a suitable modulation decoder (e.g., RLL decoder) for decoding the redundancy symbols for each of the interleaved ECC codewords. The interleaved ECC codewords are then divided by the factors of a generator polynomial, as is well known in the art, for generating error syndromes used to detect and correct errors in the codewords, thereby generating decoded codewords 64A.

When the N-way ECC decoder 106 determines that one or more of the interleaved ECC codewords is uncorrectable, it transfers the decoded codeword(s) 64A (if any) to the local memory 66 and activates the retry signal 40 applied to the memory controller 68. During the subsequent retry operations, the memory controller 68 generates the enable signal 70 at the appropriate times and concurrently applies the bits of the decoded codeword(s) 72A stored in the local memory 66 to the multiple-input sequence detector 58 in order to bias the computing of the state metrics. Once the data block (data sector) is successfully decoded by the N-way ECC decoder 106, it is decoded by a suitable modulation decoder (e.g., RLL decoder 126) and the decoded user data 109 is transferred to the host.

Errors typically occur in disk drives due to defects in the disk which result in burst errors that affect a long number of consecutive symbols. Thus, the disk drive 10 of FIG. 3 increases the efficiency of the ECC code by interleaving the symbols of a data sector to form multiple interleaved ECC codewords. In this manner when a burst error is encountered, the error is spread across the multiple codewords such that the correction power and circuitry needed to correct the error in each interleaved ECC codeword is less than that needed to correct the burst error occurring in a single codeword. For example, if a data sector comprises three interleaved ECC codewords and a burst error corrupts three consecutive symbols, then the burst error will corrupt one symbol in each codeword rather than corrupting three symbols in one codeword. Thus, the cost and complexity of the disk drive is reduced since less circuitry is required to correct fewer errors in each codeword, and since the circuitry for decoding each codeword can be shared.

The accurate decoding of a data sector requires the successful decoding of each interleaved ECC codeword. In the situation where one or more of the interleaved ECC codewords is uncorrectable, the disk drive will initiate a retry operation which conventionally entailed repeating the steps performed during the initial read operation: rereading the data sector, detecting an estimated data sequence, and ECC decoding the estimated data sequence in the hope that the signal noise will change rendering the interleaved ECC codewords correctable. Disk drive 10 enhances the retry operation by recognizing that when one or more of the interleaved ECC codewords is successfully decoded, the bits of the decoded codeword(s) 72A can be used to guide the multiple-input sequence detector 58 through the trellis during the time indices corresponding to the known bit values in the decoded codeword. This significantly improves the accuracy of the multiple-input sequence detector 58 by correcting errors in the uncorrectable interleaves of the previously uncorrectable ECC codewords.

Figure 4A:
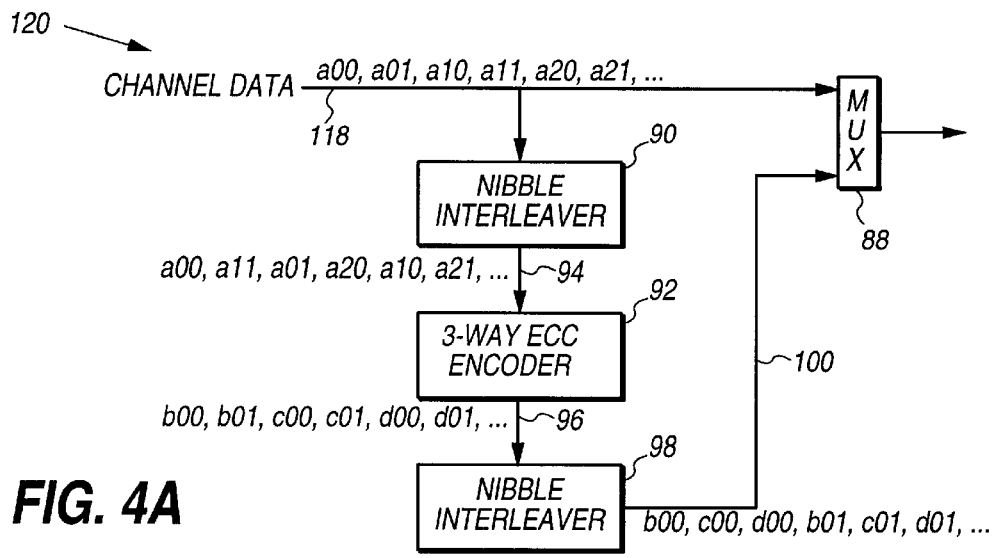
FIG. 4A is a block diagram of the ECC encoder shown in FIG. 3 comprising a 3-way interleaver for generating a block of data comprising 3-interleaved ECC codewords written to the disk.
Figure 4B:
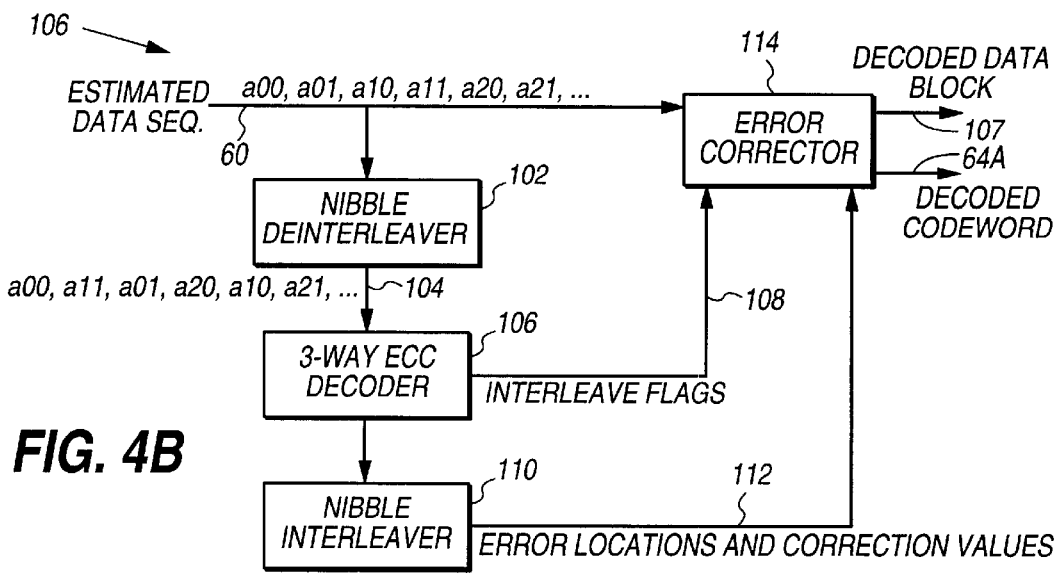
FIG. 4B illustrates the 3-way deinterleaving, ECC decoding, and interleaving steps involved with decoding the 3-interleaved ECC codewords during a read operation.
Figure 4C:
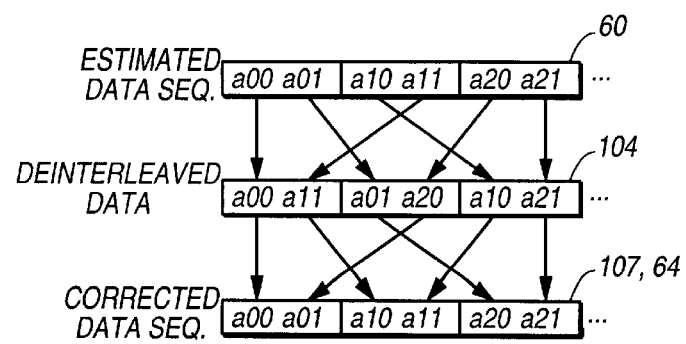
FIG. 4C further illustrates the 3-way deinterleaving and decoding operations of the ECC decoder of FIG. 4B.

FIGS. 4A, 4B, and 4C illustrate an example embodiment of a suitable interleaved ECC system. In this embodiment, a suitable block ECC code, such as the well known Reed-Solomon ECC code, is used to encode the user data into three interleaved ECC codewords. Preferably, the ECC codewords comprise a predetermined number of 8-bit data symbols followed by a predetermined number of 8-bit redundancy symbols. In a 512 byte data sector, for example, two of the interleaved ECC codewords comprise 171 data bytes while the other interleaved ECC codeword comprises 170 data bytes. A predetermined number of redundancy bytes are appended to each of the interleaved ECC codewords, where the number of redundancy bytes determines the error correction capability of the ECC code. In order to further enhance the performance gain realized by using the bits of a decoded codeword 72A for modifying the operation of the multiple-input sequence detector 58 during retry operations, the data is first interleaved on nibble boundaries before it is byte interleaved into the interleaved ECC codewords. In this manner, the bits of a decoded codeword(s) are spread more intermittently through the trellis which improves performance.

Referring now to FIG. 4A which is a block diagram of the N-way ECC encoder 120 of FIG. 3, the channel data 118 to be encoded is transmitted to a multiplexer 88 and to a nibble interleaver 90. The sequence a00, a01, a01, 11, a20, a21, ...

denotes consecutive nibbles in the channel data 118, that is, a00 represents nibble 0 in byte 0, a01 represents nibble 1 in byte 0, a10 represents nibble 0 in byte 1, etc... The nibble interleaver 90 performs a 3-way interleave on the nibble boundaries of the channel data 118 such that the output of the nibble interleaver 90 is a00, a11, a01, a20, a10, a21, ...

The output of the nibble interleaver 90 is then encoded using a 3-way ECC encoder 92 which encodes the nibble interleaved data sequence 94 into three interleaved ECC codewords, where the interleaving performed by the 3-way ECC encoder 92 is on the byte boundaries of the data sequence 94. The 3-way ECC encoder 92 produces redundancy bytes 96 for three interleaved ECC codewords (b,c,d) preferably by dividing each interleave of the channel data 118 represented as a polynomial by a generator polynomial using well known techniques. The resulting sequence of redundancy bytes 96 is represented as b00, b01, c00, c01, d00, d01, b10, b11, ...

where b00, b01 represent the first and second nibble of the first redundancy byte of the first interleaved ECC codeword, c00, c01 represent the first and second nibble of the second redundancy byte of the second interleaved ECC codeword, and so on. The redundancy symbols 96 are then interleaved by nibble interleaver 98 which interleaves the nibbles of the redundancy bytes 96 to produce an interleaved sequence of redundancy nibbles 100 of the form b00, c00, d00, b01, c01, d01, ...

which facilitates the decoding operation during read back. As the redundancy bytes are generated for the channel data 118, the channel data 118 are passed through multiplexer 88 and written to the disk 4. The interleaved sequence of redundancy nibbles 100 are then passed through the multiplexer 88 and written to the disk 4 to complete the write operation for the current data sector.

An overview of the N-way ECC decoder 106 of FIG. 3 for decoding a data sector during read back is shown in FIG. 4B. The estimated data sequence 60 output by the multiple-input sequence detector 58 of FIG. 3 is input into a nibble deinterleaver 102 which performs the same function as nibble interleaver 90 of FIG. 4A in order to deinterleave the estimated data sequence 60 into its constituent interleaved ECC codewords. The three ECC codewords in the deinterleaved data sequence 104 are then decoded by a suitable 3-way ECC decoder 106, such as the well known Reed-Solomon ECC decoder. A Reed-Solomon decoder operates by dividing the received codeword polynomial by factors of the generator polynomial to generate error syndromes. Non-zero error syndromes indicate that errors exist in the received codeword in which case the error syndromes are further processed to compute the error locations and correction value. If the number of errors in a particular interleaved ECC codeword exceeds the error correction capability of the ECC code, then the codeword is deemed uncorrectable. The ECC decoder generates interleave flags 108 to indicate which interleaved ECC codewords are uncorrectable. If one or more of the interleaved ECC codewords are correctable, then a nibble interleaver 110 interleaves the error locations to correspond to the interleaved estimated data sequence 60, and transmits the error locations and correction values 112 to an error corrector 114. The error corrector 114 process the error locations and correction values 112 to make the appropriate corrections to the estimated data sequence 60. If all three interleaved ECC codewords are correctable, then the error corrector 114 transmits the corrected data block 107 to the RLL decoder 126. If one or more of the interleaved ECC codewords are correctable (decodable) but one or more are uncorrectable, as indicated by the interleave flags 108, then the bits of the decoded codeword(s) 64A are used to guide the multiple-input sequence detector 58 during the retry operation. The bits of the decoded codeword(s) 64 are output by the error corrector 114 and stored in the local memory 66 of FIG. 3 for use in modifying the multiple-input sequence detector 58 during the retry operations.

The nibble deinterleaving, decoding and interleaving operations performed during read back is further understand with reference to FIG. 4C. The estimated data sequence 60 is first deinterleaved on the nibble boundaries to generate a deinterleaved data sequence 104 in order to deinterleave the estimated data sequence 60 into its three constituent codewords. The codewords are then decoded by the 3-way ECC decoder 106, and the error locations and correction values are reinterleaved in order to correct the estimated data sequence 60 to thereby form a corrected data sequence which is either the decoded data block 107 if all of the interleaved ECC codewords are successfully decoded, or the bits of a decoded codeword 64A for use in modifying the multiple-input sequence detector 58 during a retry operation. Note that the decoded codeword is 64A in FIG. 4C corresponds to the estimated data sequence 60 detected by the multiple-input sequence detector 58. This facilitates applying the bits of the decoded codeword 72A to the metrics calculator 80 of FIG. 2 at the appropriate times in order to correctly bias the computing of the state metrics during the retry operations.

Figure 5A:
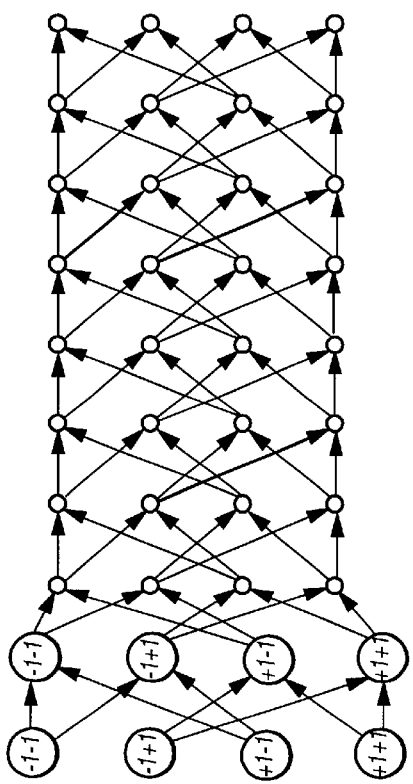
FIG. 5A is a trellis diagram illustrating the operation of a conventional PR4 sequence detector.
Figure 5B:
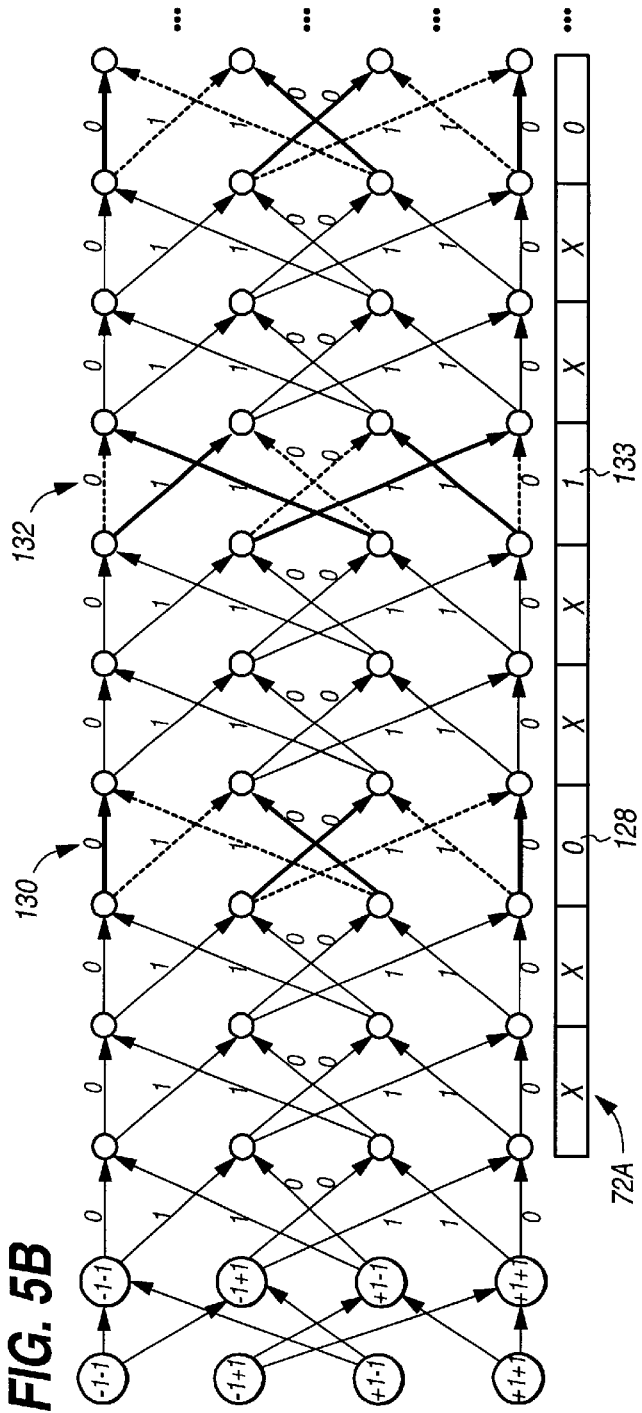
FIG. 5B illustrates how the reliability metrics of a decoded codeword modify the branch metrics in the conventional PR4 trellis of FIG. 5A.

An example in which the bits of a decoded codeword 72A are used to modify the computing of the state metrics is illustrated in FIG. 5A and FIG. 5B. FIG. 5A shows a conventional trellis for a PR4 sequence detector, and FIG. 5B shows how the conventional trellis of FIG. 5A would be modified using the bits of a decoded codeword 72A. In this example, one of three interleaved ECC codewords has been successfully decoded during the initial read operation of a data block, the bits of which are used to modify the trellis diagram shown in FIG. 5B. In order to simplify the illustration, the decoded codeword 72A shown in FIG. 5B is bit interleaved as opposed to nibble interleaved as described above. Thus, every third bit of the estimated data sequence detected using the trellis corresponds to every third of the decoded codeword 72A. At every third time index through the trellis, the transition branches are modified by deleting those branches which correspond to the incorrect bit. For example, the first bit of the decoded codeword is a "0" bit 128 and therefore the branches corresponding to a detected "1" bit are deleted from the trellis at time index 130. Since it is known that the estimated data sequence at time index 130 must be a "0" bit 128, the branches corresponding to a detected "0" bit at time index 130 are shown using darker lines to indicate that the branch metrics corresponding to a "0" bit at time index 130 are all zero. Similarly, at time index 132 the branches corresponding to a detected "0" bit are deleted from the trellis and the branch metrics corresponding to a detected "1" bit are set to zero since the corresponding bit 133 in the decoded codeword 72A is a "1" bit. Modifying the trellis intermittently using the bits of a decoded codeword improves the accuracy of the estimated data sequence because certain erroneous paths through the trellis are prevented from being selected.

When nibble interleaving is employed in the trellis diagram of FIG. 5B, the bits of the decoded codeword 72A would occur in groups of four and the corresponding branches in the trellis would be modified over four consecutive time indices. The number of bits interleaved is not a limiting aspect; a different number of bits could be interleaved which may provide different levels of performance for different degrees of complexity.

Figure 6:
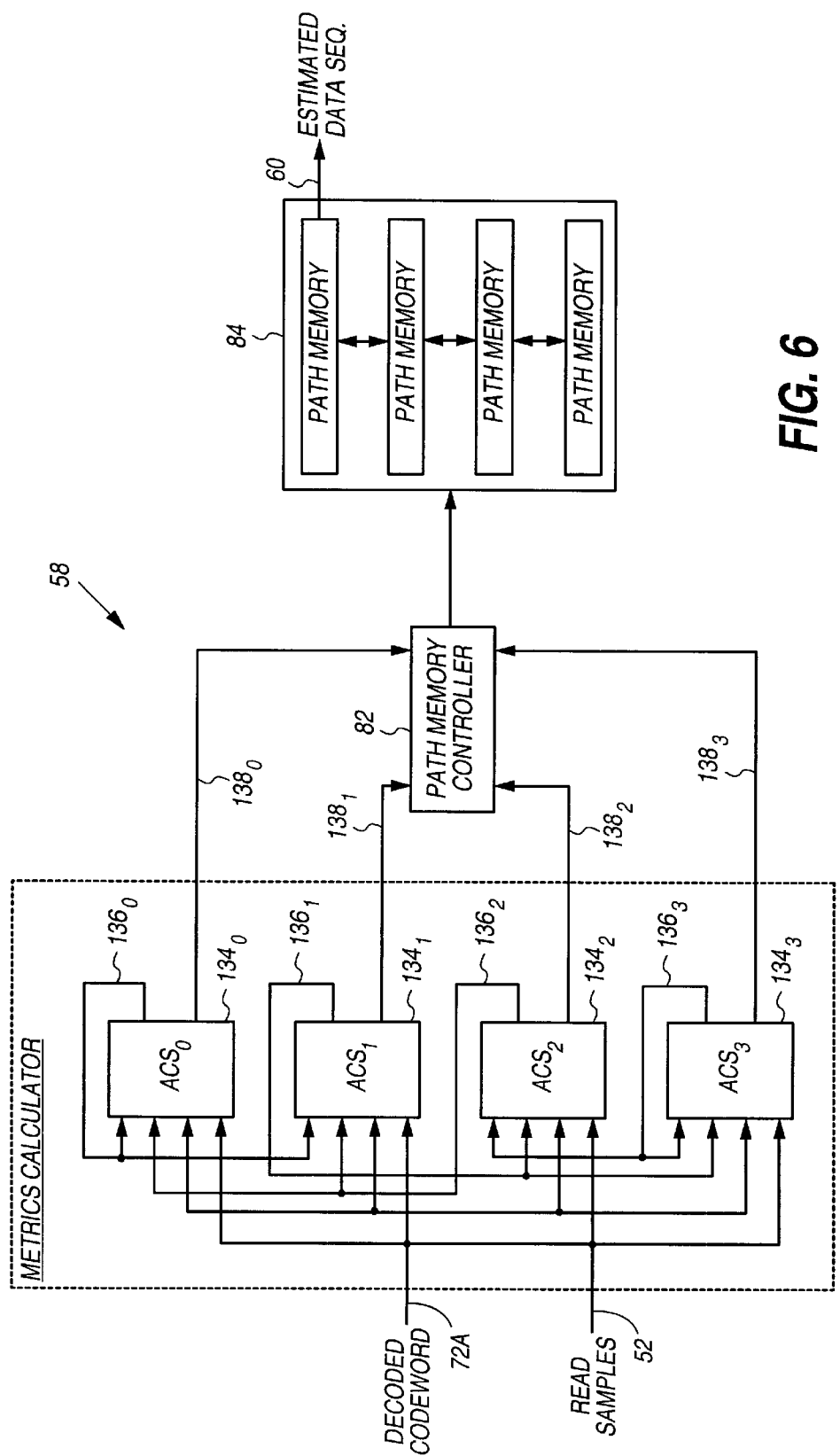
FIG. 6 is a diagram of a PR4 Viterbi sequence detector wherein the metrics calculator of FIG. 2 comprises a plurality of add-compare-select (ACS) circuits.

An overview of a multiple-input sequence detector 58 implemented as a PR4 Viterbi sequence detector responsive to the bits of decoded codeword(s) during retry operations is shown in FIG. 6. In Viterbi sequence detectors, the metrics calculator 80 of FIG. 2 is implemented as a plurality of add-compare-select (ACS) circuits which compute a state metric for each state in of the Viterbi sequence detector's state transition diagram. A PR4 Viterbi sequence detector, for example, has four states in its state transition diagram and corresponding trellis as shown in FIG. 5A, and therefore a PR4 Viterbi sequence detector comprises four ACS circuits ($134_0$–$134_3$) as shown in FIG. 6. Each ACS circuit $134_n$ is responsive to the read signal samples 52 during an initial read operation, as well as to the bits of the decoded codeword 72A during retry operations. Each ACS circuit $134_n$ computes a state metric ($136_0$–$136_3$) as the accumulated squared difference between the read signal samples and expected samples of valid output sequences. To facilitate computing the state metrics ($136_0$–$136_3$), each ACS circuit $134_n$ is responsive to two of the state metrics ($136_0$–$136_3$) that correspond to the two branches entering each state in the PR4 trellis shown in FIG. 5A. For example, the first ACS circuit $134_0$ of FIG. 6 corresponds to state (−1,−1) of FIG. 5A which has a branch input from state (−1,−1) and from state (+1,−1). Thus, the ACS circuit $134_0$ of FIG. 6 is responsive to the state metric $136_0$ generated by ACS circuit $134_0$ and to the state metric $136_2$ generated by ACS circuit $134_2$.

Each ACS circuit ($136_0$–$136_3$) computes a state metric (Euclidean metric) for each input branch, and then selects the input branch that results in the smallest accumulated metric. The smallest accumulated metric is stored and used as that state's metric for computing the new state metrics for the next read signal sample value. The results ($138_0$–$138_3$) of the comparisons output by each of the ACS circuits ($134_0$–$134_3$) are processed by the path memory controller 82 which loads the appropriate estimated bits into the path memories 84 that correspond to the branches selected by the ACS circuits ($134_0$–$134_3$). The path memory controller 82 also merges the appropriate paths in the path memories 84 based on the branches that were not selected by the ACS circuits ($134_0$–$134_3$). A suitable modification to the ACS circuits ($134_0$–$134_3$) using the bits of a decoded codeword in order to bias the computing of the state metrics during a retry operation is understood with reference to FIG. 7A.

Figure 7A:
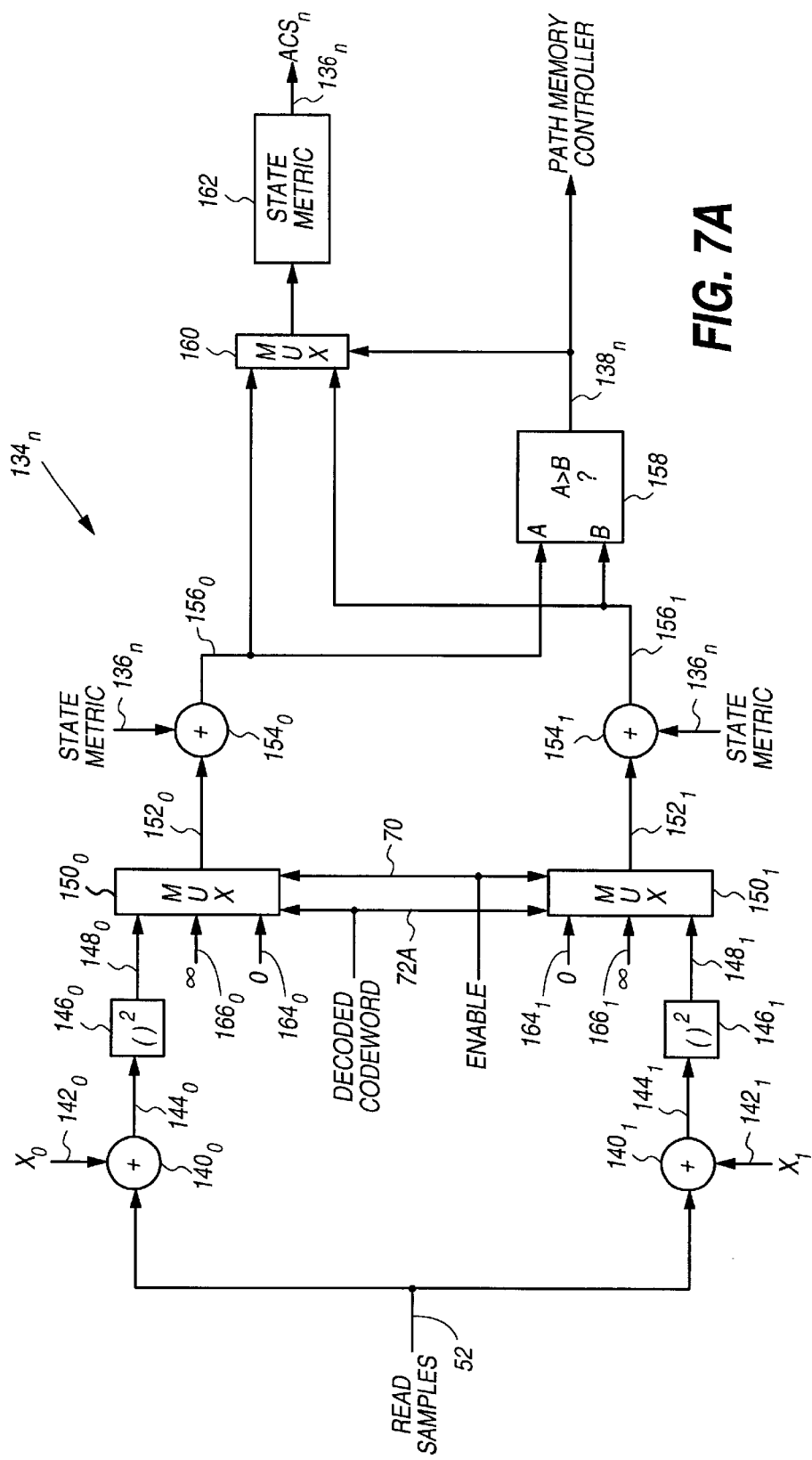
FIG. 7A illustrates how the ACS circuit of FIG. 6 could be modified to bias the computing of the state metrics in response to the bits of the decoded codeword.

The read signal samples 52 input into the ACS circuit $134_n$ of FIG. 7A are subtracted at adders $140_0$ and $140_1$ from the expected sample values $142_0$ and $142_1$ that correspond to a detected "0" bit or a detected "1" bit. The expected sample values $142_0$ and $142_1$ correspond to the expected sample values 78 for each of the two branches entering each state shown in the PR4 trellis of FIG. 5A. The differences $144_0$ and $144_1$ between the current read signal sample 52 and the expected samples $142_0$ and $142_1$ are then squared by squares $146_0$ and $146_1$ to generate Euclidean branch metrics $148_0$ and $148_0$ corresponding to each input branch of the ACS circuit $134_n$. During an initial read operation, the bits of the decoded codeword 72A are undefined so the Euclidean branch metrics $148_0$ and $148_1$ are passed through multiplexers $150_0$ and $150_1$ as selected by the enable signal 70 from the memory controller 68 of FIG. 7. The Euclidean branch metrics $148_0$ and $148_1$ at the outputs $152_0$ and $152_1$ of the multiplexers $150_0$ and $150_1$ are then added at adders $154_0$ and $154_1$ to the state metrics $136_n$ corresponding to each branch entering the ACS circuit to form accumulated Euclidean metrics $156_0$ and $156_1$. The accumulated Euclidean metrics $156_0$ and $156_1$ are then compared at comparator 158 which generates a compare signal $138_n$ indicating which of the accumulated Euclidean metrics $156_0$ and $156_1$ is the smaller metric. That is, the comparator 158 performs the function of selecting the input branch that corresponds to the smallest accumulated Euclidean metric. The compare signal $138_n$ selects the smaller of the accumulated Euclidean metrics $156_0$ and $156_1$ through multiplexer 160 which is then stored in a register 162 and used as the new state metric $136_n$ for the ACS circuit $134_n$ during the subsequent processing of the next read signal sample value 52. The compare signal $138_n$ is also output to the path memory controller 82 of FIG. 6 which updates the path memories 84 with the bits of the estimated data sequence corresponding to the selected branch and merges the path memories 84 based on the branch not selected.

During retry operations, the bits of the decoded codeword 72A are used to bias the computing of the state metric $136_n$. The memory controller 68 of FIG. 3 transfers the bits of the decoded codeword 72A to the ACS circuits $134_n$ and activates the enable signal 70 at the appropriate time (i.e., when processing the read signal samples 52 that correspond to a bit in the decoded codeword 72A). The enable signal 70 allows the bit in the decoded codeword 72A to control the operation of the multiplexers such that they output a zero value (0) or infinite value (∞). For example, if the bit in the decoded codeword 72A is a "0" bit, then multiplexer $150_0$ is configured to output a zero value (0) $164_0$, and multiplexer $150_1$ is configured to output an infinite value (∞) $166_1$. Conversely, if the bit in the decoded codeword 72A is a "1" bit, then multiplexer $150_0$ is configured to output an infinite value (∞) $166_0$, and multiplexer $150_1$ is configured to a zero value (0) $164_1$. In other words, the bit in the decoded codeword 72A provides a priori knowledge about the expected values for the Euclidean branch metrics $152_0$ and $152_1$ added to the state metrics $136_n$ at adders $154_0$ and $154_1$. If the bit is known to be a "0" bit, then the Euclidean branch metric $152_0$ computed for the "0" bit is set to a zero value (0) $164_0$ so that no distance is accumulated for that path, and the Euclidean branch metric $152_1$ computed for the "1" bit is set to an infinite value (∞) $166_1$ so that that path is not selected by the comparator 158. When a bit in the estimated sequence corresponds to an uncorrected bit in one of the uncorrected interleaved ECC codewords, the multiplexers $150_0$ and $150_1$ are configured to pass the Euclidean branch metrics $148_0$ and $148_1$ computed from the read signal sample value 52 and the expected sample values $142_0$ and $142_1$. The infinite value (∞) $166_0$ and $166_1$ shown in FIG. 7A is not actually equal to infinity but set to some large value that will ensure the corresponding Euclidean branch metric will never be selected by the comparator 158.

Figure 7B:
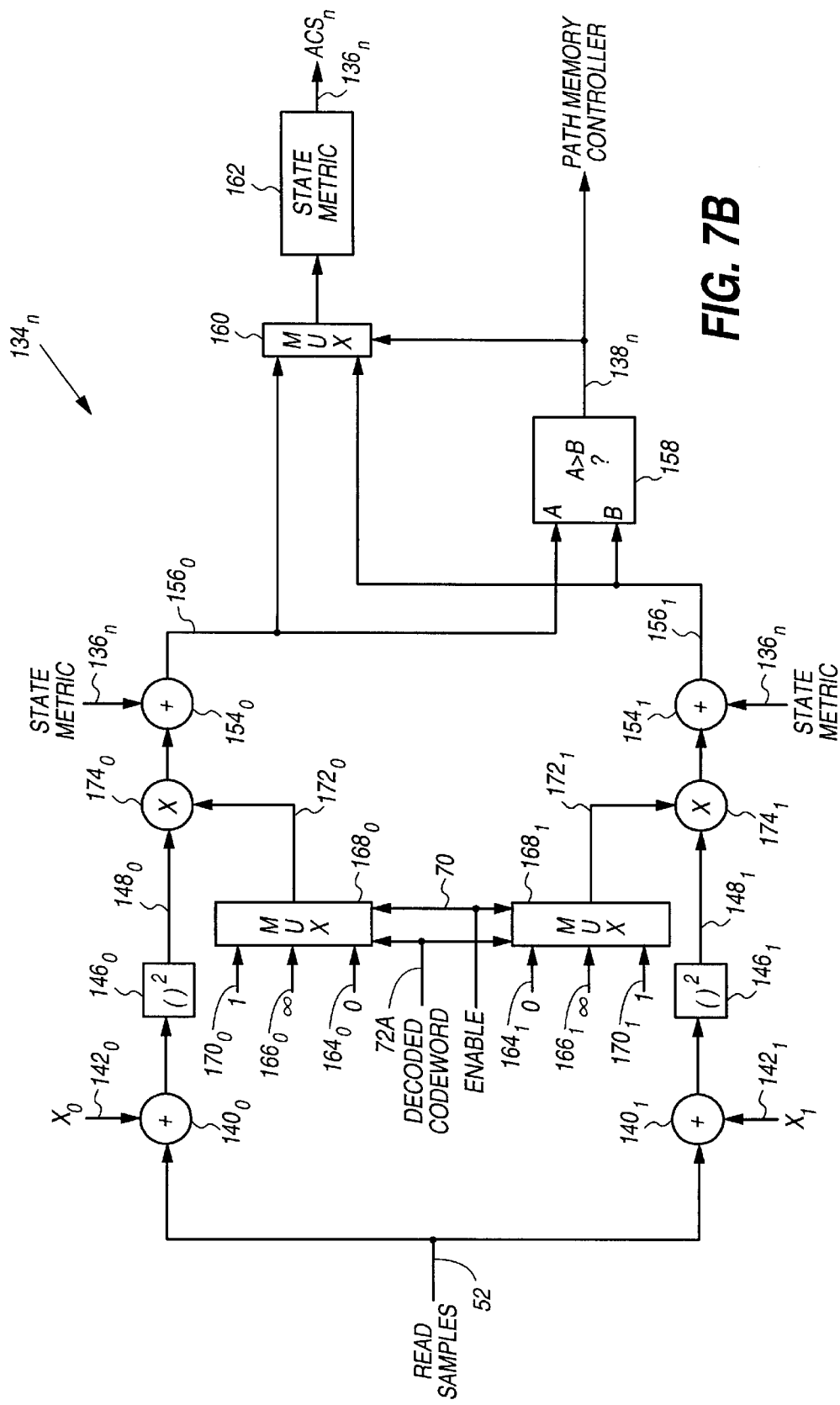
FIG. 7B shows an alternative embodiment for the ACS circuit of FIG. 6 for biasing the computing of the state metrics in response to the bits of the decoded codeword.

The particular way in which the bits of a decoded codeword 72A bias the computing of the state metrics during a retry operation is not a limiting aspect of the present invention. For example, an alternative embodiment for the ACS circuit $134_n$ of FIG. 6 is shown in FIG. 7B wherein the enable signal 70 and bit of a decoded codeword 72A select via multiplexers $168_0$ and $168_1$ either the zero value (0) $164_0$ and $164_1$ or the infinite value (∞) $166_0$ and $166_1$ when a bit in the decoded codeword 72A is available, and select a one value (1) $170_0$ and $170_1$ during the initial read operation as well as when a bit in a decoded codeword 72A is unavailable during retry operations. The outputs $172_0$ and $172_1$ of the multiplexers $168_0$ and $168_1$ are then multiplied at multipliers $174_0$ and $174_1$ by the Euclidean branch metrics $148_0$ and $148_1$ in order to bias the computing of the Euclidean branch metrics $148_0$ and $148_1$ to provide the equivalent effect as in FIG. 7A.

The particular structure for the multiple-input sequence detector 58 of FIG. 1 is also not intended as a limiting aspect. The multiple-input sequence detector 58 shown in FIG. 6 is a PR4 Viterbi sequence detector, but other PR detectors, such as the EPR4 or EEPR4 Viterbi sequence detector, could be employed. In addition, there are various alternative embodiments for any given sequence detector. For example, an alternative embodiment for the PR4 Viterbi sequence detector of FIG. 6 is to factor the output of the $(1-D^2)$ PR4 channel into two interleaved dicode sequences, and then detect the interleaved dicode sequences using respective sliding threshold detectors rather than using ACS circuits. In this embodiment, the threshold detectors are modified by the reliability metrics (e.g., the bits of a decoded codeword) to bias the computing of the state metrics. In particular, the threshold levels in the threshold detectors could be modified by the reliability metrics. Still further, the present invention is not limited to Viterbi sequence detectors; other types of sequence detectors, such as the iterative sequence detectors of a Turbo code decoder, could be used as described below with reference to FIG. 8.

In an alternative embodiment, the read signal samples 52 generated during the initial read operation are buffered in samples buffer 107. When the N-way ECC decoder 106 cannot successfully decode all of the interleaved codewords for the data block being read, then during the retry operation the multiple-input sequence detector 58 processes the read signal samples stored in samples buffer 107 together with the reliability metrics 72 while waiting for the disk 4 to rotate to the beginning of the current data block being read. If while waiting for the disk to rotate the data block can be successfully decoded using the read signal samples stored in the samples buffer 107, then the retry operation terminates before rereading the data block from the disk. This can expedite the retry operation by avoiding the disk rotation latency in situations where it is not necessary to reread the data block in order to regenerate the read signal samples 52.

Iterative Sequence Detector

Figure 8:
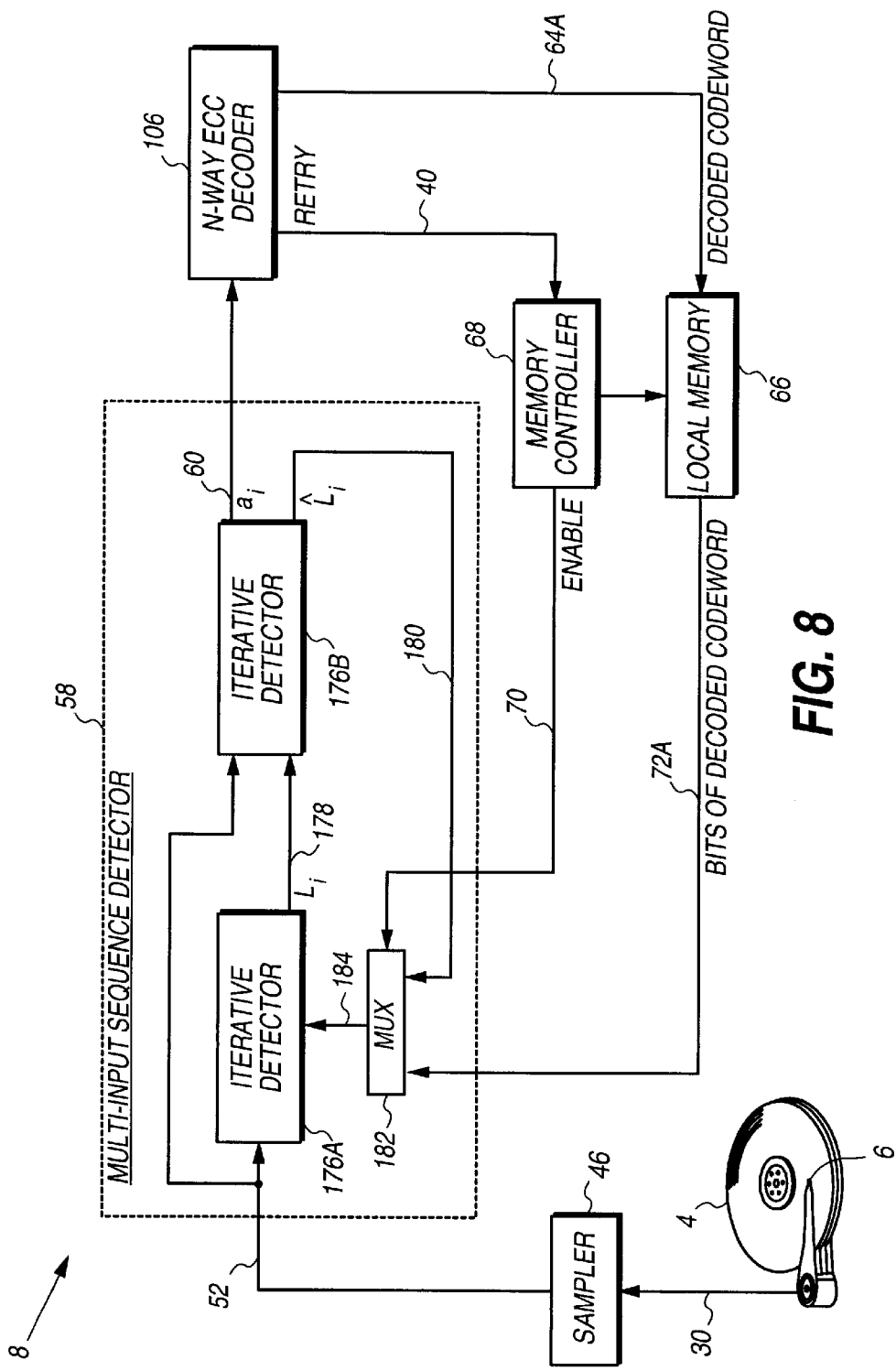
FIG. 8 shows an alternative embodiment of the present invention wherein the multiple-input sequence detector of FIG. 1 comprises two iterative detectors.

Referring to FIG. 8, shown is an alternative embodiment for the multiple-input sequence detector 58 comprising at least one iterative detector, and in the embodiment shown in FIG. 8, comprising two iterative detectors 176A and 176B. The reliability metrics 72 stored in the local memory 66 of FIG. 1 are used during a retry operation to modify the operation of at least one of the iterative detectors 176A or 176B.

Iterative detectors, such as the iterative detectors 176A and 176B shown in FIG. 8, pass reliability metrics between one another in iterative passes. After each pass, the reliability metrics are updated toward a higher reliability until the output of one of the iterative detectors is deemed reliable enough for ECC decoding. Similar to a Viterbi sequence detector, an iterative detector attempts to maximize the log-likelihood ratio of an estimated data sequence through a trellis given a sequence of read signal samples. As part of the detection algorithm, the iterative detector computes an extrinsic log-likelihood value which is used as a reliability metric during the next iteration by the companion iterative detector. A predetermined number of redundancy symbols are encoded into the recorded data such that the reliability metrics passed between the iterative decoders are independent estimates of the log-likelihood ratio for the estimated data sequence. Typical iterative detectors employ a suitable interleaver between a first and second encoder during a write operation, and a suitable deinterleaver/reinterleaver between the first and second iterative detectors during a read operation. An overview of the operation and implementation of iterative detectors is provided by Hagenauer, Offer and Papke, "Iterative Decoding of Binary Block and Convolutional Codes", *IEEE Transactions on Information Theory*, Vol. 42, No. 2, March 1996, and by C. Berrou, A. Glavieux, and P. Thitimajshima, "Near Shannon Limit Error-Correcting Coding and Decoding: Turbo-Codes(1)," *Proc., IEEE Int. Conf on Comm.*, (Geneva, Switzerland), pp. 1064–1070, May 1993, the disclosures of which are herein incorporated by reference.

Referring again to FIG. 8, during an initial read operation the first iterative detector 176A processes the read signal samples 52 to generate an estimated data sequence in the form of a first sequence of reliability metrics $L_i$ 178. The second iterative detector 176B processes the read signal sample values 52 together with the first sequence of reliability metrics $L_i$ 178 to generate a second sequence of reliability metrics $\hat{L}_i$ 180. After the second iterative detector 176B is finished processing the read signal sample values 52, the first iterative detector 176A again processes the read signal sample values 52 together with the second sequence of reliability metrics $\hat{L}_i$ 180 to regenerate the first sequence of reliability metrics $L_i$ 178 which typically would have a higher degree of reliability than that generated during the first pass. The second iterative detector 176B again processes the read signal sample values 52 together with the first sequence of reliability metrics $L_i$ 178 to generate the second sequence of reliability metrics $\hat{L}_i$ 180 having a still higher reliability. This process continues for several iterations after which one of the iterative detectors 176A or 176B outputs a binary estimated data sequence 60 with respect to the reliability metrics $L_i$ 178 or $\hat{L}_i$ 180. The binary estimated data sequence 60 is then processed by the N-way ECC decoder 106 which attempts to successfully decoded the interleaved ECC codewords into the output data sequence 109 decoded by the RLL decoder 126 of FIG. 3. If the interleaved ECC codewords cannot all be successfully decoded, the bits of the interleaved ECC codeword(s) that are successfully decoded are stored in the local memory 66, and the bits of the decoded codeword 72A are used to modify the operation of the multiple-input sequence detector during the retry operations.

During the retry operations, the memory controller 68 transfers the bits of the decoded codeword(s) 72A from the local memory 66 to the multiple input sequence detector 58 at the appropriate time. The memory controller 68 also generates the enable signal 70 which is used to control a multiplexer 182 in order to multiplex the bits of the decoded codeword 72A (if available) into the first iterative detector 176A for use in generating the first sequence of reliability metrics $L_i$ 178. Otherwise, the multiplexer 182 passes the reliability metrics $\hat{L}_i$ 180 from the second iterative detector 176B to the first iterative detector 176A for use in generating the first sequence of reliability metrics $L_i$ 178. Depending on the implementation, it may be necessary to convert the bits of the decoded codeword 72A into a format consistent with the format of the reliability metrics $L_i$ expected by the iterative sequence detector 176A.

In an alternative embodiment, the bits of the decoded codeword 72A could be used to modify the operation of the second iterative sequence detector 176B, which could be made in place of, or in addition to, modifying the operation of the first iterative sequence detector 176A.

In yet another alternative embodiment understood with reference to FIG. 8, the reliability metrics $\hat{L}_i$ 180 generated by the second iterative detector 176A could be saved at the end of an initial read operation and then used during the retry operations, thereby avoiding the latency in generating the second sequence of reliability metrics $\hat{L}_i$ 180 during the retry operations. In other words, the memory in the second iterative sequence detector 176B could be used to store the second sequence of reliability metrics $\hat{L}_i$ 180 so that the reliability metrics $\hat{L}_i$ 180 are available during the first pass through the first iterative sequence detector 176A at the beginning of the retry operations. Using bits of a decoded codeword 72A to modify the operation of the multiple-input sequence detector 58 is optional in this embodiment, but if implemented, the bits of the decoded codeword 72A are multiplexed 182 into the first iterative sequence detector 176A at the appropriate times.

Retry Procedure

Figure 9A:
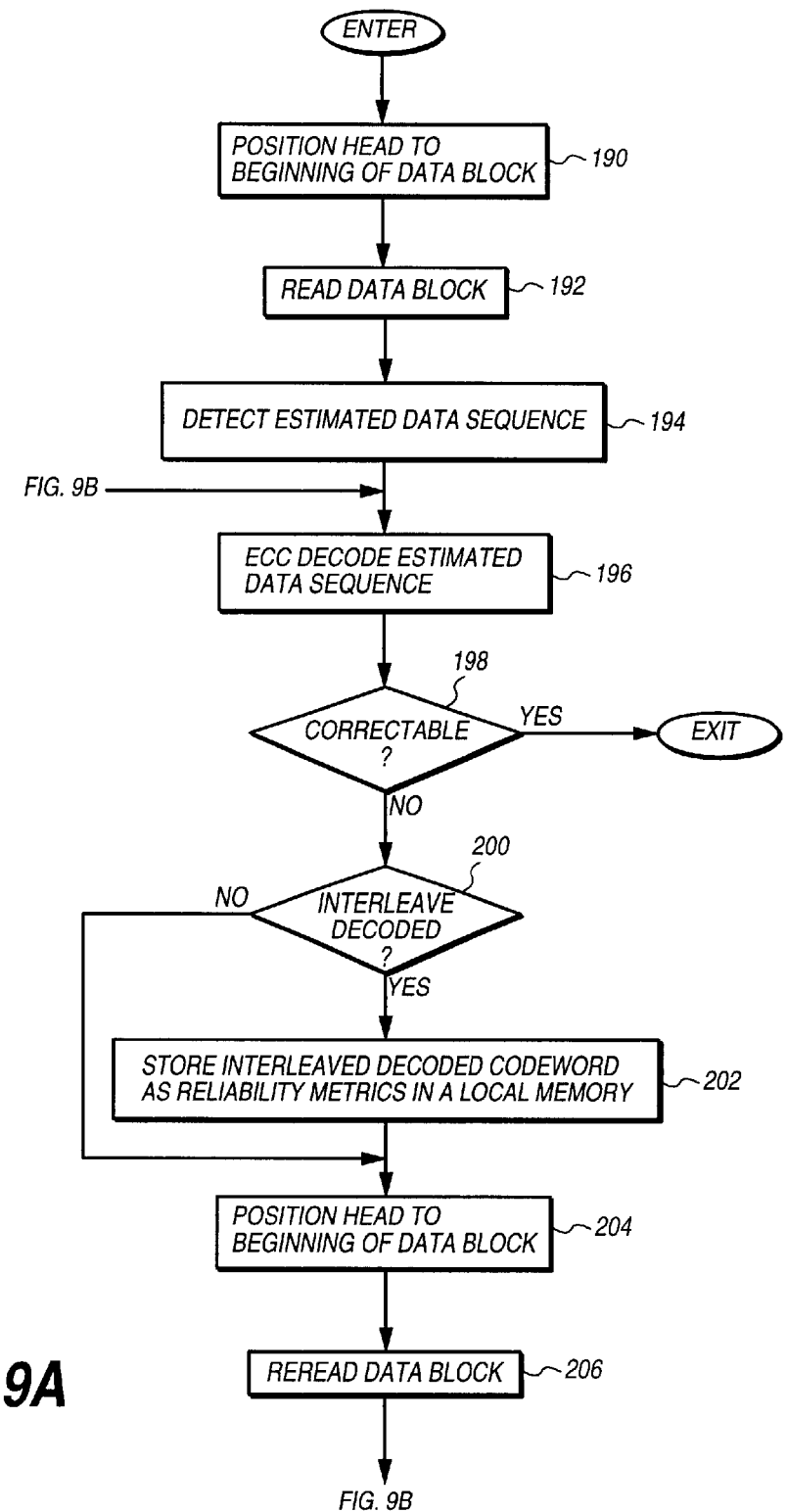
FIGS. 9A and 9B are flow diagrams illustrating the steps for detecting and decoding a data block during an initial read operation, and for detecting and decoding the data block during a retry operation using the reliability metrics generated during the initial read operation.
Figure 9B:
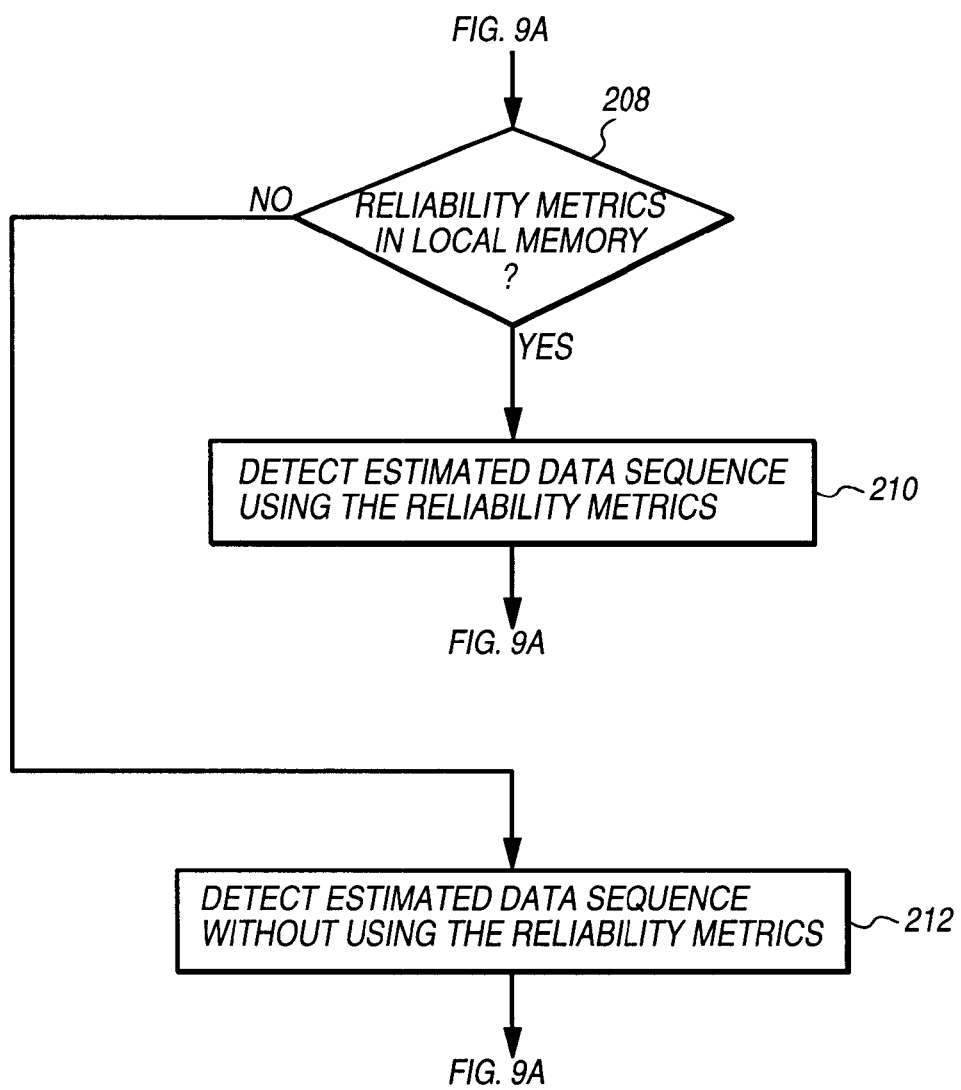

FIG. 9A and FIG. 9B are flow diagrams illustrating an example retry procedure executed during retry operations for the ECC embodiment employed in disk drive 10 of FIG. 3. A similar flow diagram would be executed for implementing the iterative sequence detector embodiment described above with reference to FIG. 8. The steps in the flow diagrams of FIG. 9A and FIG. 9B may be embodied in software or firmware executed by a microprocessor, or in hardware using suitable digital logic,.

With reference now to FIG. 9A, at step 190 the head 6 is positioned to the beginning of a data block (e.g., a data sector). The data block is then read at step 192, and at step 194 the multiple-input sequence detector 58 detects an estimated data sequence 60 from the read signal 30. At step 196, the N-way ECC decoder 106 of FIG. 3 processes the estimated data sequence 60 to decode the constituent interleaved ECC codewords; if at step 198 the interleaved ECC codewords are correctable, the decoded user data 109 is transferred to the host and the read operation terminates normally. However, if it is determined at step 198 that the data block is not decodable because one or more of the interleaved ECC codewords are uncorrectable, then at step 202 the bits of the interleaved ECC codewords that were successfully decoded (if any) are stored as reliability metrics in the local memory 66. A retry operation is then initiated by first positioning the head 6 to the beginning of the data block at step 204 and then rereading the data block at step 206.

Continuing now with reference to FIG. 9B, at step 208 a branch is executed depending on whether any of the interleaved ECC codewords were successfully decoded and stored as reliability metrics in local memory 66 during the previous read operation. If so, then at step 210 the multiple-input sequence detector 58 detects the estimated data sequence 60 using the reliability metrics stored in local memory 66. Otherwise, at step 212 the multiple-input sequence detector 58 detects the estimated data sequence 60 without using reliability metrics. The flow diagram of FIG. 9A is then re-executed starting at step 196 where the N-way ECC decoder 106 again attempts to decode the interleaved ECC codewords in the estimated data sequence 60. The iterative retry operation is repeated until at least one of the interleaved ECC codewords is successfully decoded, at which time the multiple-input sequence detector 58 detects the estimated data sequence 60 at step 210 using reliability metrics stored in local memory 66. The reliability metrics stored in local memory 66 improve the accuracy of the estimated data sequence 60, thereby increasing the probability of successfully decoding the previously uncorrected interleaved ECC codewords. Eventually, either all of the interleaved ECC codewords are successfully decoded and the read operation terminates normally, or the number of iterations exceeds some predetermined maximum and the data block is deemed unrecoverable.

I claim:

1. A disk drive (2) comprising:
   (a) a disk (4) for storing a data block;
   (b) a head (6) for reading the data block to generate an analog read signal (30) during an initial read operation;
   (c) a sampler (46) for sampling the analog read signal (30) to generate a sequence of read signal sample values (52);
   (d) a multiple-input sequence detector (58), responsive to the read signal sample values (52), for generating an initial estimated data sequence (60) during the initial read operation;
   (e) a reliability metrics generator (62) for generating reliability metrics (64) representing an estimated reliability for data in the initial estimated data sequence (60);
   (f) a local memory (66) for storing the reliability metrics (64); and
   (g) a memory controller (68) for transferring the reliability metrics (64) stored in the local memory (66) to the multiple-input sequence detector (58);
   wherein during a retry operation, the data block is reread from the disk (2), the memory controller (68) transfers the reliability metrics (64) generated during the initial read operation to the multiple-input sequence detector (58), and the multiple-input sequence detector (58) generates a retry estimated data sequence using the reliability metrics (64), whereby the reliability metrics improves the probability of accurately detecting the retry estimated data sequence.

2. The disk drive as recited in claim 1, wherein:
   (a) the multiple-input sequence detector comprises a metrics calculator for computing state metrics relative to the read signal sample values and expected sample values of valid output sequences; and
   (b) during the retry operation, the computing of the state metrics is biased by the reliability metrics.

3. The disk drive as recited in claim 2, wherein:
   (a) the multiple-input sequence detector comprises a first iterative detector and a second iterative detector, and the metrics calculator for computing the state metrics comprises a first metrics calculator in the first iterative detector and a second metrics calculator in the second iterative detector;
   (b) the first iterative detector generates first alternative reliability metrics for use by the second iterative detector, and the second iterative detector generates second alternative reliability metrics for use by the first iterative detector;
   (c) the first iterative detector biases the computing of the state metrics using the second alternative reliability metrics;
   (d) the second iterative detector biases the computing of the state metrics using the first alternative reliability metrics; and
   (e) at least one of the iterative detectors biases the computing of the state metrics using the reliability metrics stored in the local memory.

4. The disk drive as recited in claim 1, wherein:
   (a) the initial estimated data sequence comprises at least two interleaved error correction code codewords comprising a plurality of bits;
   (b) the reliability metrics generator comprises an error correction circuit which decodes at least one of the interleaved error correction code codewords into a decoded codeword; and
   (c) the reliability metrics comprise bits of the decoded codeword.

5. The disk drive as recited in claim 4, wherein the initial estimated data sequence comprises a plurality of nibble interleaved error correction code codewords.

6. The disk drive as recited in claim 1, wherein the multiple-input sequence detector is a Viterbi sequence detector.

7. The disk drive as recited in claim 1, wherein the multiple-input sequence detector is an iterative detector.

8. The disk drive as recited in claim 1, wherein:
   (a) the reliability metrics generator is an iterative detector; and
   (b) the local memory is integrated into the iterative detector.

9. The disk storage system as recited in claim 1, further comprising a samples buffer for storing the read signal samples during the initial read operation, wherein during the retry operation the multiple input sequence detector is responsive to the read signal samples stored in the samples buffer and the reliability metrics stored in the local memory for detecting the retry estimated data sequence while the disk storage medium is rotating to the beginning of the data block.

10. A method of improving a retry operation in a disk drive comprising the steps of:
    (a) reading a data block stored on a disk to generate an analog read signal;
    (b) sampling the analog read signal to generate a sequence of read signal sample values;
    (c) detecting an estimated data sequence from the read signal sample values;
    (d) computing reliability metrics representing an estimated reliability for data in the estimated data sequence;
    (e) storing the reliability metrics in a local memory; and
    (f) during a retry operation, repeating at least steps (a) through (c) wherein the step of detecting an estimated data sequence is responsive to the reliability metrics generated during a previous read operation which improves the probability of accurately detecting the estimated data sequence during the retry operation.

11. The method for detecting data recorded on a disk as recited in claim 10, wherein:
   (a) the step of detecting the estimated data sequence from the read signal sample values comprises the step of computing state metrics relative to the read signal sample values and expected sample values of valid output sequences; and
   (b) during the retry operation, the step of computing the state metrics is biased by the reliability metrics.

12. The method for detecting data recorded on a disk as recited in claim 10, wherein:
   (a) the estimated data sequence comprises at least two interleaved error correction code codewords comprising a plurality of bits;
   (b) the step of computing reliability metrics comprises the step of decoding at least one of the interleaved error correction code codewords into a decoded codeword; and
   (c) the reliability metrics comprise bits of the decoded codeword.

13. The method for detecting data recorded on a disk as recited in claim 12, wherein the estimated data sequence comprises a plurality of nibble interleaved error correction code codewords.

14. The method for detecting data recorded on a disk as recited in claim 10, wherein the state metrics are associated with a trellis of a Viterbi sequence detector.

15. The method for detecting data recorded on a disk as recited in claim 10, wherein the state metrics are associated with a trellis of an iterative detector.

16. The method for detecting data recorded on a disk as recited in claim 10, wherein:
   (a) the reliability metrics are generated by an iterative detector; and
   (b) the local memory is integrated into the iterative detector.

17. The method for detecting data recorded on a disk as recited in claim 10, wherein the step of detecting the estimated data sequence further comprises the step of selectively biasing the computing of the state metrics using alternative reliability metrics generated by an iterative detector.

18. The method for detecting data recorded on a disk storage medium as recited in claim 10, further comprising the steps of;
   storing the read signal samples in a samples buffer during the initial read operation; and
   during the retry operation and while waiting for the disk storage medium to rotate to the beginning of the data block, detecting the retry estimated data sequence from the read signal samples stored in the samples buffer and the reliability metrics stored in the local memory.

* * * * *